United States Patent [19]

McIver et al.

[11] Patent Number: 5,530,247
[45] Date of Patent: Jun. 25, 1996

[54] MILLIMETER WAVE IMAGER DEVICE USING PYROELECTRIC EFFECT

[75] Inventors: George W. McIver, Redondo Beach; Samatkumar R. Sashital, Irvine, both of Calif.

[73] Assignee: TRW Inc., Redondo Beach, Calif.

[21] Appl. No.: 286,736

[22] Filed: Aug. 5, 1994

[51] Int. Cl.$^6$ ........................................................ G01J 5/10
[52] U.S. Cl. ........................... 250/336.1; 250/338.1
[58] Field of Search ........................... 250/336.1, 338.2, 250/338.3, 338.4

[56] References Cited

U.S. PATENT DOCUMENTS

| | | | |
|---|---|---|---|
| 3,792,379 | 2/1974 | Auston et al. | 332/7.57 |
| 4,952,811 | 8/1990 | Elliott | 250/338.2 |
| 5,438,336 | 8/1995 | Lee et al. | 342/174 |

OTHER PUBLICATIONS

"Millimeter-Wave Imaging Using Preamplified Diode Detector," IEEE Microwave and Guided Wave Letters, vol. 2, No. 7, Jul., 1992.

Young et al, "Passive millimeter wave imaging" TRW Quest Mag. vol. 13, No. 12, pp. 3–20, Winter 1990/1991.

*Primary Examiner*—Davis L. Willis
*Assistant Examiner*—Richard Hanig

[57] ABSTRACT

A passive millimeter-wave imaging system configured as an integrated circuit. The imaging system incorporates a lens which focuses radiation from a scene onto a detector in the focal plane of the lens. The detector includes an outer array of ferroelectric elements in which each element includes a top metal film and a ferroelectric layer. Millimeter-wave radiation from the beam causes charge build-up in the ferroelectric layers. The charge build-up is sensed by appropriate amplification and signal processing circuitry associated with the read-out electronics so as to provide a signal indicative of obstacles in the scene to a video system. The ferroelectric layer can also be used as an antenna for each pixel element.

20 Claims, 1 Drawing Sheet

MILLIMETER WAVE IMAGER DEVICE USING PYROELECTRIC EFFECT

BACKGROUND OF THE INVENTION

1. Field of the Invention

This invention relates generally to a millimeter-wave imaging system and, more particularly, to a millimeter-wave imaging system including an array of ferroelectric elements which sense radiation as a result of the pyroelectric effect.

2. Discussion of the Related Art

Present day imaging systems of the type used in connection with aircraft, including commercial, private and military aircraft, that provide detailed images of a scene are well known in the art. These imaging systems provide a mechanism so as to enable aircraft operators to avoid collisions and detect runways in low visibility conditions, such as at night and in foul weather. Such imaging systems are not limited to aircraft environments, however, but are also applicable in connection with other systems requiring imaging, such as surveillance systems and mapping systems.

Original imaging systems of this type made use of visible light detection by flying spot scanners, well known to those skilled in the art. However, visible light imaging had obvious limitations in low light situations and poor weather conditions because of the shortage of light and the limits of visible light to be transmitted through certain atmospheric conditions such as fog, haze, rain, dust, smoke, etc.

Radar imaging offered a next generation of detection which was fairly effective for imaging a scene in low visibility and poor weather conditions. Radar imaging is an active imaging system in that a transmitter is used to emit a signal which is then reflected from objects in the scene and detected by receivers associated with the radar imaging system. However, radar imaging does not provide the level of resolution necessary for many situations, thus limiting detection of many objects in many conditions. Another drawback with radar imaging is that the need for a transmitter provides greater chance of detection in stealth situations.

More recent imaging systems make use of infrared radiation as the mechanism by which objects are detected. Infrared radiation is effective for detecting objects because of the ability of infrared radiation to penetrate atmospheric condition such as fog, clouds, haze and the like. Unlike radar imaging, infrared imaging is a passive imaging system in that sensors associated with the infrared imaging systems rely on infrared radiation emitted from the objects in the scene. Infrared imaging systems which incorporate sensors that make use of the pyroelectric effect of ferroelectric films are known in the art. See for example, E. H. Putley, "Thermal Detectors in Optical and Infrared Detectors," 2nd ed., Topics in Applied Physics, Vol. 19, Springer-Verlas, New York. The pyroelectric effect occurs as a result of radiant energy causing an increase in the temperature of a ferroelectric material, which in turn causes a charge build-up in the material that can be detected. An infrared imaging system of this type incorporates an imaging array having a series of ferroelectric elements that are positioned on an appropriate substrate so as to detect infrared radiation. Charge induced by temperature changes in the ferroelectric elements caused by the radiation is sensed by appropriate signal processing circuits which then generate an output signal that is displayed by a video system.

Passive millimeter-wave imaging has been demonstrated as being an effective mechanism for penetrating the atmospheric conditions mentioned above so as to provide landing assistance and surveillance capabilities for aircraft. In many cases, millimeter-wave radiation can penetrate these atmospheric conditions better than infrared radiation. One known passive millimeter wave imaging device is disclosed in Lam, Wayne et al., "Millimeter-Wave Imaging Using Preamplified Diode Detector", IEEE MICROWAVE AND GUIDED WAVE LETTERS, Vol. 2, No. 7, July 1992, pp. 276–277. Known passive millimeter-wave imaging systems have relied on mechanical scanning of pencil beam antennas to cover a field of view with one or a few millimeter-wave receivers. These types of antennas are similar to the flying spot scanners used in visible light imaging. However, these mechanical scanning antennas do not provide the best signal-to-noise ratio and image updating which could be realized. Additionally, picture elements (pixels) of focal plane arrays in the known millimeter-wave imaging systems incorporate antennas, such as Vivaldi antennas, for each pixel. Such antennas add to the cost and complexity of the imaging systems.

What is needed is an imaging system that is able to provide an image through most atmospheric conditions and that includes detectors capable of providing a heightened signal-to-noise ratio. It is therefore an object of the present invention to provide such an imaging system.

SUMMARY OF THE INVENTION

In accordance with the teachings of the present invention, a passive millimeter-wave imaging system is disclosed which incorporates an array of ferroelectric elements that utilize the pyroelectric effect for detecting radiation in the millimeter-wave range. In one preferred embodiment, a semiconductor substrate is provided. Semiconductor device layers incorporating read-out electronics are fabricated on the substrate in an integrated fashion. An array of ferroelectric elements are deposited on top of the semiconductor device layers. Each ferroelectric element is a pixel in which each pixel incorporates a ferroelectric layer and a top metal film. An optical system focuses radiation from a scene onto the ferroelectric array. This optical system would ordinarily incorporate a high dielectric constant medium to make the diffraction limited resolution of the optics consistent with the small detector elements. The diffraction limit is approximately equal to the quarter-wavelength of the radiation, so the medium should be of order 3000 in dielectric constant in order to attain best performance match between the optical system and the ferroelectric detector array. Heat from millimeter-wave radiation in the beam causes charge build-up in the ferroelectric elements which is read by amplifiers and signal processing circuits in the read-out electronics so as to be converted to a readable image and displayed by a video screen.

Additional objects, advantages, and features of the present invention will become apparent from the following description and appended claims, taken in conjunction with the accompanying drawings.

DETAILED DESCRIPTION OF THE PREFERRED EMBODIMENTS

The following discussion of the preferred embodiments concerning a passive millimeter-wave imaging system using an array of ferroelectric elements is merely exemplary in nature and is in no way intended to limit the invention or its applications or uses.

Figure 1:
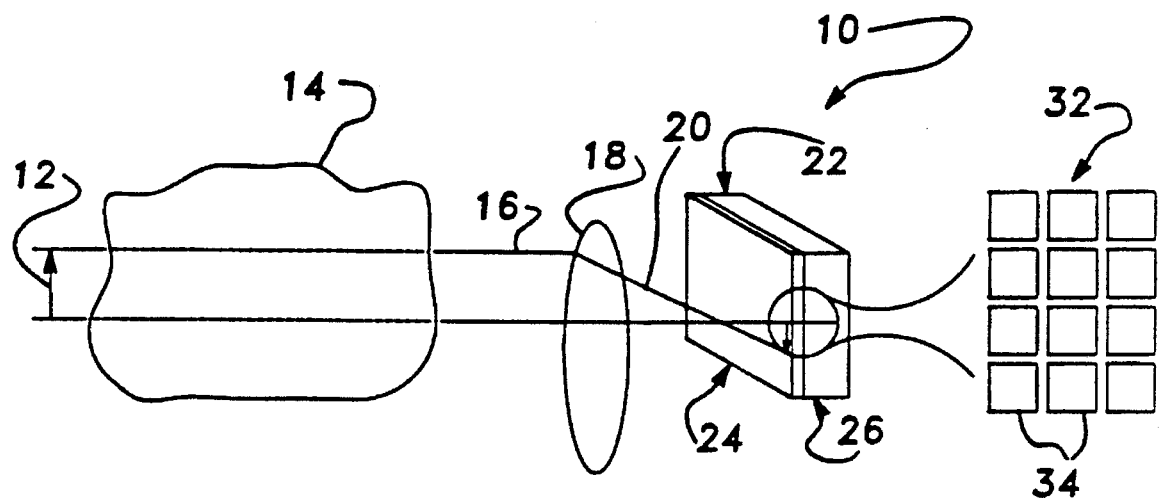
FIG. 1 is a schematic view of a passive millimeter-wave imaging system according to a preferred embodiment of the present invention.

FIG. 1 shows a schematic view of a passive millimeter-wave imaging system 10 according to a preferred embodiment of the present invention. The system 10 is of the type that can be incorporated as part of a collision avoidance system on a commercial airliner or other type of aircraft, and is specifically adaptable for use as an imaging systems in foul weather conditions. However, the system 10 would also be applicable as part of other imaging systems for detecting objects that are not associated with air travel.

The system 10 is operable to detect obstacles, terrain and landing sites within a particular scene 12. The scene 12 is the field of view of the system 10 and is determined by directional mechanisms, such as scanners (not shown) and apertures (not shown), associated with the system 10, as would be well understood in the art. The scene 12 may be obscured by many atmospheric conditions 14, such as, but not limited to, rain, fog and haze. Millimeter wavelength radiation 16 within the frequency range of about 1 GHz to about 100 GHz would effectively penetrate and pass through the atmospheric condition 14 substantially unimpeded. The millimeter-wave radiation 16 which is received by the system 10 impinges an optical system such as a lens 18. The lens 18 images the radiation 16 so that a focused beam of radiation 20 impinges a front face of a detector 22 that is positioned in the focal plane of the lens 18. The detector 22 includes a ferroelectric film 24 on its front face that receives the focused beam of radiation 20. Appropriate readout electronics 26, known in the art, are positioned behind the film 24 in order to measure the intensity of the beam 20 and provide an output signal indicative of this intensity. An expanded view of a port ion of a front surface of the ferroelectric film 24 is shown as an array of ferroelectric elements 32. The array 32 includes a number of separate individual ferroelectric elements 34 in which each ferroelectric element 34 represents a pixel of the detector 22.

The operation of the pyroelectric effect within ferroelectric materials is well understood. Heat from the beam 20 generates electrostatic charges in the film 24. These charges are sensed by appropriate amplifiers (not shown) and low frequency signal processing, conditioning and multiplexing circuits (not shown) in the readout electronics 26 in a manner well understood to those skilled in the art. The signal developed as a result of the measured charge increase from the radiation beam 20 is then sent to a video circuit (not shown) to display the scene 12 in a manner which is readable by an operator associated with the aircraft. In the system 10, a chopper (not shown) would be incorporated so as to intermittently apply the radiation 16 to the lens 18 in order to provide a zero reference when no radiation interacts with the film 24, as is well understood in the art.

Figure 2:
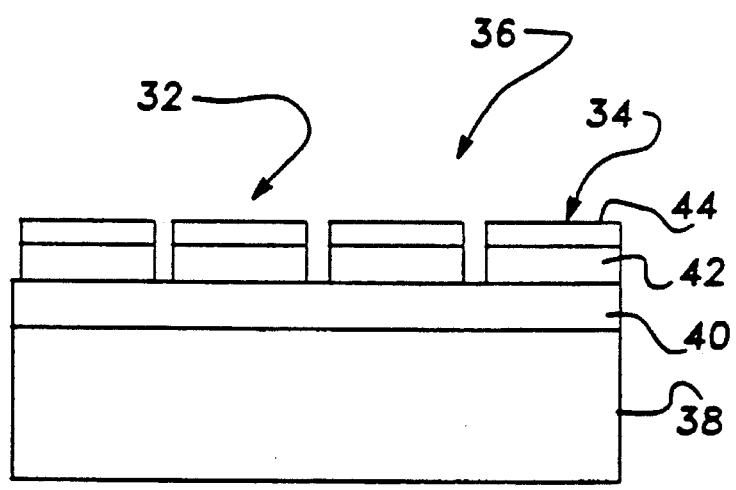
FIG. 2 is a profile view of a passive millimeter-wave imaging system according to a preferred embodiment of the present invention.

FIG. 2 shows a profile view of an integrated circuit 36 of the expanded portion of the array 32 incorporating imaging components according to a preferred embodiment of the present invention. The integrated circuit 36 includes a substrate 38 on which is fabricated a semiconductor device layer 40. The array 32 is then fabricated on the device layer 40. More than one semiconductor device layer 40 may be included. Each ferroelectric element 34 includes a ferroelectric layer 42 and a top metal film layer 44. The top metal layer 44 is a broadband absorbing, semitransparent film so as to provide good surface contact for the conduction of heat. In one embodiment, the layer 44 is a film of oxidized chromium. In an integrated circuit format, the read-out electronics 26 would either be part of the device layer 40 or would be a separate device layer (not shown). Different circuit configurations for processing the signal of charge build up in the ferroelectric pixels 34 could be used without departing from the spirit of the invention, as would be well understood to one of ordinary skill in the art.

One of the desirable qualities of the system 10 is that the ferroelectric film 24, the readout electronics 26 and the semiconductor device layer 40 can all be configured as part of an integrated circuit on the substrate 38. Therefore, the circuit 36 can be manufactured in a cost effective manner, and can cover minimal space. In one embodiment, the substrate 38 is gallium arsenide (GaAs) having a thickness of about 20 mils. The substrate 38 may also be silicon. Each ferroelectric element 34 has a facial dimension of about 25 microns×25 microns, for example. Each ferroelectric layer 42 is approximately 2 microns thick and the thickness of the corresponding metal layer 44 is approximately within the range of 100–300 Å. Further, there are approximately 200 vertical elements 34 and 200 horizontal elements 34 on a chip approximately ½ centimeter by ½ centimeter.

As mentioned above, prior art millimeter-wave imaging systems incorporate antennas associated with each pixel in order to receive the radiation. Because ferroelectric materials have very high dielectric constants, it is possible to use the ferroelectric film 24 as an antenna as well as a detecting element. It therefore becomes apparent that the prior art millimeter-wave imaging system can be upgraded by incorporating detector elements of arrays of ferroelectric materials in order to increase the signal-to-noise ratio and also reduce the size of the system.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A passive millimeter-wave imaging system for imaging a scene, said system comprising:

a substrate;

a semiconductor device layer positioned on said substrate; and an array of thin film ferroelectric elements integrated on the semiconductor device layer, each of the ferroelectric elements of the array representing a pixel of the imaging system, said ferroelectric elements being responsive to millimeter-wave radiation from the scene and generating an electrostatic charge indicative of millimeter-wave energy in the radiation, wherein the semiconductor device layer includes readout electronics which sense the charge and provide a signal indicative of an image of the scene.

2. The imaging system according to claim 1 wherein each ferroelectric element includes a ferroelectric layer and a top metal layer in contact with the ferroelectric layer.

3. The imaging system according to claim 1 further comprising a lens, said lens focusing the radiation on the ferroelectric element array, said array of ferroelectric elements being substantially in the focal plane of the lens.

4. The imaging system according to claim 1 wherein the substrate is gallium arsenide.

5. The imaging system according to claim 1 wherein the substrate is silicon.

6. The imaging system according to claim 2 wherein each ferroelectric layer is approximately 2 microns thick and each top metal layer is approximately 100–300 Å thick.

7. The imaging system according to claim 2 wherein the top metal layer is a broadband absorbing, semitransparent film.

8. The imaging system according to claim 2 wherein the top metal layer is oxidized chromium.

9. A passive millimeter-wave imaging system comprising a semiconductor substrate, a semiconductor device layer and an array of thin film ferroelectric elements, said semiconductor device layer being supported on the substrate and said array of ferroelectric elements being integrated on the semiconductor device layer, said ferroelectric elements receiving radiation from a scene and generating an electrostatic charge indicative of temperature increases in the ferroelectric elements as a result of millimeter-wave energy in the radiation, said semiconductor device layer being responsive to the electrostatic charge generated in the ferroelectric elements so as to provide an electrical signal indicative of the charge.

10. The imaging system according to claim 9 wherein the semiconductor device layer includes read-out electronics, said read-out electronics sensing the charge and providing a signal indicative of an image of a scene from which the millimeter-wave energy is generated.

11. The imaging system according to claim 9 wherein the thin film ferroelectric elements are approximately two microns thick.

12. The imaging system according to claim 9 wherein each ferroelectric element includes a ferroelectric layer and a top metal layer.

13. The imaging system according to claim 12 wherein the top metal layer is a broadband absorbing, semitransparent film.

14. The imaging system according to claim 12 wherein the top metal layer is oxidized chromium.

15. The imaging system according to claim 9 further comprising a lens, said lens focusing the radiation onto the array of ferroelectric elements.

16. The imaging system according to claim 9 wherein the imaging system is part of an integrated circuit.

17. A method of imaging a scene, said method comprising the steps:

providing a semiconductor substrate;

providing a semiconductor device layer on said substrate;

providing an array of thin film ferroelectric elements integrated on the semiconductor device layer;

focusing radiation from the scene onto the ferroelectric elements such that millimeter-wave energy in the radiation heats the ferroelectric elements and causes an electrostatic charge build-up which is measured, wherein the step of providing a semiconductor device layer includes sensing the electrostatic charge build-up and providing a signal indicative of an image of the scene.

18. The method according to claim 17 wherein the step of providing a semiconductor substrate includes providing a gallium arsenide substrate, and the step of providing an array of ferroelectric elements includes providing an array of ferroelectric elements in which each ferroelectric element is approximately two microns thick.

19. The method according to claim 17 wherein the step of focusing the radiation includes providing a lens which focuses the radiation onto the ferroelectric elements.

20. The method according to claim 17 wherein the step of providing an array of ferroelectric elements includes providing an array of ferroelectric elements in which each ferroelectric element includes a ferroelectric layer and a top metal layer, said top metal layer being a broad-band absorber.

* * * * *